United States Patent [19]
Kruggel

[11] 3,886,468
[45] May 27, 1975

[54] HIGH GAIN AMPLIFIER

[75] Inventor: Robert Henry Kruggel, Jericho, Vt.

[73] Assignee: International Business Machines Corporation, Armonk, N.Y.

[22] Filed: Dec. 20, 1973

[21] Appl. No.: 426,845

[52] U.S. Cl................. 330/30 D; 307/238; 307/251; 330/35; 330/38 M

[51] Int. Cl.............................................. H03f 3/68

[58] Field of Search...... 307/235, 238, 251; 330/18, 330/30 D, 35, 38 M, 69

[56] References Cited

UNITED STATES PATENTS 3,548,388 12/1970 Sonoda.......................... 307/238 X

OTHER PUBLICATIONS

Tertlel, "Differential Amplifier," IBM Technical Disclosure Bulletin Vol. 13, No. 2, pp. 484–485 July 1970 (330–30 D)

*Primary Examiner*—R. V. Rolinec
*Assistant Examiner*—Lawrence J. Dahl
*Attorney, Agent, or Firm*—Stephen J. Limanek

[57] ABSTRACT

An amplifier providing high gain and capable of handling small signals utilizes a controlled current source as the load for an input dependent current source. In one embodiment, a differential amplifier is provided which has a common constant current source to which two parallel branches or circuits are connected. Each of the branches includes a controlled current source and an input dependent current source, such as a field effect transistor, coupling the common current source to the controlled current source. Differential input signals are applied between the two input dependent current sources and differential output voltages are derived from the two common points between the input dependent current sources and the controlled current sources.

10 Claims, 2 Drawing Figures

HIGH GAIN AMPLIFIER

FIELD OF THE INVENTION

This invention relates to amplifiers responsive to small signals and having a high gain which are suitable for use in integrated circuits. Such amplifiers are often desired as sense amplifiers for detecting small signals derived from very small cells which form highly dense memory arrays in integrated circuit chips or wafers. Since high density is an important factor in producing desirable memory arrays, the surface area on a chip or wafer which is utilized by the sense amplifiers should be as small as possible without sacrificing the gain required from these amplifiers.

DESCRIPTION OF THE PRIOR ART

Various amplifiers have been provided in an attempt to satisfy the many requirements imposed upon amplifiers to be used in the environment of, e.g., highly dense memory arrays formed in semiconductor chips or wafers such as the memory arrays described in commonly assigned U.S. Pat. No. 3,387,286. One type of amplifier used in integrated circuits has a pair of cross-coupled field effect transistors. This type amplifier operates satisfactorily for some applications but this amplifier will not operate until a relatively high input signal is applied thereto. This type amplifier is disclosed, e.g., in U.S. Pat. No. 3,588,844. A second type of amplifier is a differential amplifier as disclosed in IBM Technical Disclosure Bulletin, Vol. 13, No. 2, July 1970, pages 484 and 485, which employs a constant current source connected to one end of two parallel circuits, with a common voltage source connected at the other end of the parallel circuits. A first pair of bipolar transistors, one transistor in each of the parallel circuits, has a common emitter connection to the constant courrent source and a second pair of bipolar transistors are used as the load for the first pair. This conventional differential amplifier employing a constant current source and a common voltage source interconnected by two parallel circuits may also utilize field effect transistors for some applications, but not where high gain is required. These field effect transistor differential amplifiers have a gain which is highly dependent upon the width to length ratio of the field effect transistors and are process limited. Typically they provide a gain of from 5 to 10. Another type of differential amplifier is described in U.S. Pat. No. 3,317,850. This latter type employes field effect transistors and load resistors which are difficult to fabricate in field effect transistor technology.

SUMMARY OF THE INVENTION

Accordingly, it is an object of this invention to provide an amplifier circuit which detects very small signals and has a very high gain.

It is another object of this invention to provide an amplifier, simple in construction, which is readily produced in integrated circuit environments having a very high density of circuits.

Yet another object of this invention is to provide an improved high gain amplifier which can be produced by employing conventional insulating gate field effect transistor technology processes.

A further object of this invention is to provide a differential amplifier having very high gain for small signals.

Still another object of this invention is to provide a differential amplifier utilizing field effect transistors which provides high gain.

These and other objects of the invention are obtained by providing an amplifier having a controlled current source as a load for a serially connected input dependent current source. In one embodiment of the invention a differential amplifier is provided which has a common constant current source or sink and a common voltage source interconnected by a pair of parallel circuits each having a controlled current source serially connected to an input dependent current source or device, with the output connected to each of the parallel circuits at the common point between the controlled current source and the input dependent current source. In a preferred embodiment, the input dependent current sources are field effect transistors each having a gate electrode between which a differential input signal is applied.

The foregoing and other objects, features and advantages of the invention will be apparent from the following more particular description of the preferred embodiment of the invention, as illustrated in the accompanying drawing.

DESCRIPTION OF THE PREFERRED EMBODIMENT

Figure 1:
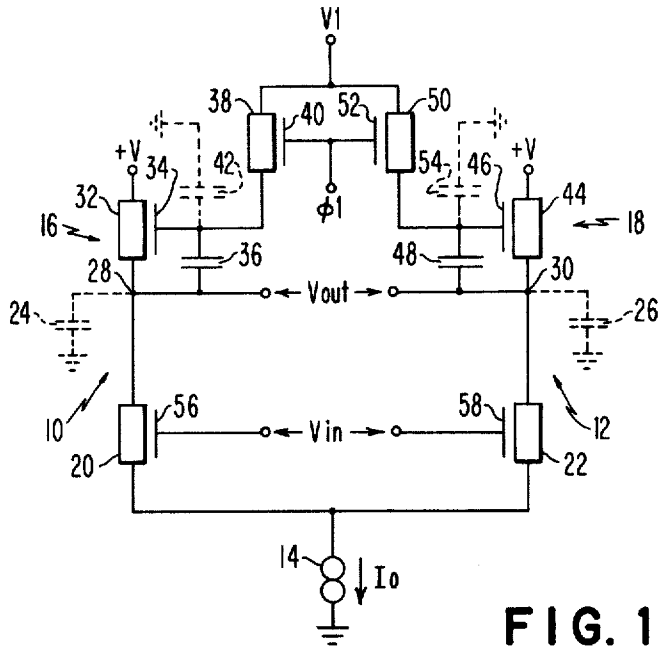
FIG. 1 is a circuit diagram of the amplifier of the present invention.

Referring now to the drawing in more detail, as shown in FIG. 1, an embodiment of the amplifier of the present invention includes first and second parallel circuits 10 and 12 coupled at one end to a common constant current source 14 and at the other end to a common voltage source indicated as +V. The parallel circuits 10, 12 each include a controlled current source 16, 18 and an input dependent current source or device shown as a field effect transistor 20, 22 serially connected with the controlled current sources 16 and 18. At the common point 28 between controlled current source 16 and transistor 20 in circuit 10 there is a stray capacitance 24 going to ground and at the common point 30 between the controlled current source 18 and the transistor 22 in circuit 12 there is a stray capacitance 26 going to ground. The controlled current source 16 includes a field effect transistor 32 connected between +V and common point 28 and having a gate electrode 34 connected to one plate of a capacitor 36 with the other plate of the capacitor 36 being connected to common point 28. A voltage source $V_t$ is coupled to the gate electrode 34 of transistor 32 through a transistor 38 having a gate electrode 40. A clock pulse source indicated as $\phi 1$ is coupled to the gate electrode 40. A stray capacitance between gate electrode 34 of transistor 32 and ground is indicated at 42. The controlled current source 18 in circuit 12 includes a field effect transistor 44 connected between +V and common point 30 and having a gate electrode 46 connected to one plate of a capacitor 48 with the other plate of the capacitor 48 being connected to common point 30. The voltage source $V_t$ is coupled to the gate electrode 46 of transistor 44 through a transistor 50 having a gate electrode 52. The clock pulse source $\phi 1$ is also coupled to the gate electrode 52 of transistor 50. A stray capacitance between gate electrode 46 of transistor 44 and ground is indicated at 54. The input to the amplifier indicated at Vin is connected between the gate electrode 56 of transistor 20 and gate electrode 58 of transistor 22.

In the operation of the amplifier illustrated in FIG. 1, prior to applying a differential signal Vin to the gate electrodes 56 and 58 of transistors 20 and 22, respectively, a positive pulse from clock pulse source $\phi 1$ is applied to the gate electrodes 40 and 52 of transistors 38 and 50, respectively, to apply the voltage $V_1$ to the gate electrodes 34 and 46 of transistors 32 and 44, respectively. The voltage $V_1$ on gate electrode 34 charges seriallyarranged capacitors 36 and 24 until the current through transistor 32 equals the current in transistor 20 and the voltage $V_1$ on gate electrode 46 charges the serially connected capacitors 48 and 26 until the current through transistor 44 equals the current through transistor 22. At this point the clock pulse $\phi 1$ goes to ground turning off transistors 38 and 50, thus trapping charge on capacitors 36 and 48. The circuit is now prepared to receive an input signal such as a DC differential signal applied to gate electrodes 56 and 58. This signal, V*in*, applied to the gate electrodes 56 and 58 alters the current in transistors 20 and 22. Since the gate to source voltages of transistors 32 and 44 are fixed by the charge placed on capacitors 36 and 48, respectively, the current through transistors 32 and 44 does not change even though the current through transistors 20 and 22 has been changed by the differential signal V*in*. The difference in current passing through transistors 20 and 22 flows into or out of capacitors 24 and 26, respectively, producing an output voltage waveform as shown in FIG. 2 of the drawing.

Figure 2:
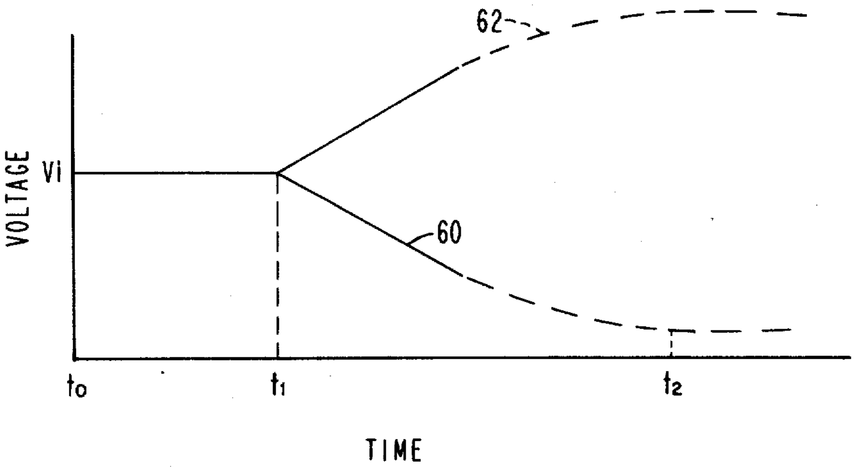
FIG. 2 is a graph of the voltages at the output terminals of the circuit illustrated in FIG. 1.

Referring to FIG. 2 of the drawing, at time $t_0$ the clock pulse source $\phi 1$ has terminated and the charging of capacitors 36 and 48 has been completed to fix the current passing through transistors 32 and 44, respectively. Also, at time $t_0$ the voltages across capacitors 24 and 26 have been set to the value V*i*, preparing the amplifier for an input signal. At time $t_1$ the differential input signal, V*in*, is applied to the gate electrodes 56 and 58. Assuming that the signal V*in* increases the positive signal at gate electrode 56, the current in transistor 20 increases and current from capacitor 24 along with the constant current flowing through transistor 32 passes through transistor 20. Since the charge on capacitor 24 has decreased the voltage at common point 28 decreases in the manner indicated by curve 60 in FIG. 2 and becomes substantially constant at time $t_2$. Since the differential input signal, V*in*, increased the positive signal at gate electrode 56, it decreased the positive signal at gate electrode 58 to decrease the current in transistor 22. This decrease in current caused the constant current flowing through transistor 44 to increase the charge on capacitor 26 which increased the voltage at common point 30 in the manner indicated by curve 62 in FIG. 2 of the drawing. The voltage at common point 30 becomes substantially constant at time $t_2$.

The difference between curves 60 and 62 of FIG. 2 indicates the magnitude and polarity of the output voltage produced at the output terminals indicated at Vout in FIG. 1 of the drawing. Of course, if the differential signal Vin applies a voltage to gate electrode 56 which decreases the positive voltage at electrode 56 and a voltage to gate electrode 58 which increases the positive voltage at electrode 58, the voltage at common point 28 increases in the manner indicated by curve 62 and the voltage at common point 30 decreases as shown by curve 60. Since the field effect transistors 20 and 22 act as input dependent current source devices, it can be readily seen that as the magnitude of the input signal V*in* increases, the difference in magnitude between curves 60 and 62 is increased at any given point of time after time $t_1$. It should also be understood that the voltage V*i* indicated in FIG. 2 is assumed to be the initial voltage established at common point 28 and at common point 30 prior to applying signal V*in*, thus producing a zero difference voltage at the output terminals V*out*. In actual practice, a small difference voltage may appear at terminals V*out* due to possible parameter variations which may be introduced in the circuit during processing. This small constant voltage will not sufficiently affect the amplified output voltage.

In one of the amplifiers of the present invention which was constructed and satisfactorily operated, the voltages $V_1$ and +V were set at 10 volts with the clock pulse voltage $\phi 1$ at +15 volts and the direct current voltage applied to each of the gate electrodes 56 and 58 at between +1 and +4 volts and a current Io through constant current source or sink 14 having a magnitude of 40 microamperes with the field effect transistor operating in their saturation region. The gain of the amplifier was found to be 20 to 30 with input signals, V*in*, detectable from approximately 20 millivolts to a maximum voltage limited, of course, by the electrical limitations of the field effect transistors employed in the amplifier of the invention. The voltage gain is affected to some degree by the stray capacitances 42 and 54 indicated in FIG. 2 of the drawing. If after the stray capacitance has been minimized, the voltage gain can be increased, if desired, by increasing the size of capacitors 36 and 48. The transient response of the circuit is improved by minimizing stray capacitances 24 and 26. If more improved transient response is required after stray capacitances 24 and 26 have been minimized, Io of constant current source 14 can be increased. The constant current source 14 may be simply, as known, a field effect transistor having an appropriate DC voltage applied to its gate electrode. The value of this DC voltage should be less than the DC voltage component applied to control electrodes 56 and 58 of transistors 20 and 22. Care should also be exercised, for optimum operation, that transistors 20, 22, 32 and 44 be operated in the saturation region.

Accordingly, it can be seen that an amplifier, simple in construction and without requiring large field effect transistors, has been provided in accordance with this invention which can detect very small input signals yet provide a gain of from 20 to 30. The small input signals, V*in*, may have a magnitude of one-tenth that of the smallest magnitude of input signals which are detectable by the cross-couple field effect transistor type referred to hereinabove.

Although the embodiment of the amplifier of the invention described hereinabove in detail in FIG. 2 utilizes two parallel circuits 10 and 12 connected to the common constant current source 14, the amplifier of the invention may be modified by eliminating the common constant current source 14 and simply using one circuit including, e. g., controlled current source 16 and serially connected transistor 20 with the series circuit being energized by constant voltage source +V. The output voltage at common point 28 from this modified amplifier results in a gain somewhat less than that obtained from the use of the complete circuit shown in FIG. 2. However, for some applications, this modified and more simplified amplifier is completely satisfactory.

While the invention has been particularly shown and described with reference to a preferred embodiment thereof, it will be understood by those skilled in the art that various changes in form and details may be made therein without departing from the spirit and scope of the invention.

What is claimed is:

1. An amplifier comprising first and second controlled current sources having first and second terminals, said first terminals having a common fixed potential, first and second input dependent current sources, a constant current source coupled through said first input dependent current source to the second terminal of said first controlled current source and through said second input dependent current source to the second terminal of said second controlled current source, means for applying differential signals to said input dependent current sources, and means coupled to said second terminals for deriving output voltages.

2. An amplifier as set forth in claim 1 wherein said input dependent current sources are first and second transistors having control electrodes and said signals applying means is connected to said electrodes.

3. An amplifier as set forth in claim 2 wherein said transistors are field effect transistors and said electrodes are gate electrodes.

4. An amplifier as set forth in claim 2 wherein said controlled current sources include third and fourth transistors having control electrodes and means for applying predetermined fixed voltages to the control electrodes of said third and fourth transistors.

5. An amplifier as set forth in claim 4 wherein said third and fourth transistors are field effect transistors having source electrodes, said control electrodes are gate electrodes and said voltages applying means includes first and second charged capacitors connected between the gate and source electrodes of said third and fourth transistors, respectively.

6. An amplifier as set forth in claim 5 further including first and second load capacitors coupled to said second terminals and wherein said load and charged capacitors are serially connected.

7. An amplifier as set forth in claim 6 further including means for charging said capacitors and wherein said charging means includes switching means for periodically charging said capacitors.

8. An amplifier as set forth in claim 7 wherein charging means includes fifth and sixth field effect transistors having constant voltage and clock pulse voltages applied thereto.

9. An amplifier as set forth in claim 7 wherein said switching means periodically charges said capacitors prior to the onset of said differential signals.

10. An amplifier comprising a constant current sink, a constant voltage source, first and second serially connected transistors coupling said constant voltage source to said constant current sink, said second transistor being interposed between said first transistor and said constant current sink, each of said transistors having a gate electrode, third and fourth serially connected transistors coupling said constant voltage source to said constant current sink, said fourth transistor being interposed between said third transistor and said constant current sink, said third and fourth transistors having gate electrodes, a first capacitor coupled to the common point between said first and second transistors, a second capacitor coupled to the common point between said third and fourth transistors, a third capacitor connected between the gate electrode of said first transistor and the common point between said first and second transistors, a fourth capacitor connected between the gate electrode of said third transistor and the common point between said third and fourth transistors, means coupled to the gate electrodes of said first and third transistors for periodically charging said first, second, third, and fourth capacitors, means for applying a differential input signal between the gate electrodes of said second and fourth transistors, and means for deriving a differential output voltage from said common points.

* * * * *